(12) United States Patent
Gilliland et al.

(10) Patent No.: US 8,007,291 B1
(45) Date of Patent: Aug. 30, 2011

(54) IMPLEMENTING DIFFERENTIAL SIGNAL CIRCUIT BOARD ELECTRICAL CONTACT

(75) Inventors: Don Alan Gilliland, Rochester, MN (US); Joseph Kuczynski, Rochester, MN (US); Amanda Elisa Ennis Mikhail, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/905,215

(22) Filed: Oct. 15, 2010

(51) Int. Cl.
*H01R 12/00* (2006.01)

(52) U.S. Cl. .......................................... 439/81; 439/59

(58) Field of Classification Search ............... 439/59, 439/81, 951, 78, 55; 174/260, 261
See application file for complete search history.

(56) References Cited

U.S. PATENT DOCUMENTS

| | | | | |
|---|---|---|---|---|
| 4,838,800 A | * | 6/1989 | Lynch | 439/78 |
| 5,055,637 A | * | 10/1991 | Hagner | 174/260 |
| 5,386,087 A | * | 1/1995 | Lee et al. | 174/261 |
| 5,450,289 A | * | 9/1995 | Kweon et al. | 439/82 |
| 6,496,381 B1 | * | 12/2002 | Groeger | 439/59 |
| 6,717,060 B2 | * | 4/2004 | Kragl et al. | 174/255 |
| 6,870,261 B2 | * | 3/2005 | Hu et al. | 439/78 |
| 7,004,794 B2 | * | 2/2006 | Wang et al. | 439/660 |
| 7,238,892 B2 | * | 7/2007 | Bois et al. | 174/260 |
| 7,282,789 B2 | * | 10/2007 | Kinsman | 257/686 |
| 2004/0121624 A1 | * | 6/2004 | Longueville et al. | 439/59 |
| 2006/0162957 A1 | * | 7/2006 | Kindermann et al. | 174/260 |

* cited by examiner

*Primary Examiner* — Briggitte R Hammond
(74) *Attorney, Agent, or Firm* — Joan Pennington

(57) ABSTRACT

A method, and structures are provided for implementing differential signal circuit board electrical contact. A removable member including a pair of independent electrical contacts is removably received within an associated contact-receiving cavity on the circuit board. The contact-receiving cavity includes a mating pair of circuit board pads. A respective dielectric is provided between each of the pair of independent electrical contacts and the mating pair of circuit board pads.

20 Claims, 5 Drawing Sheets

IMPLEMENTING DIFFERENTIAL SIGNAL CIRCUIT BOARD ELECTRICAL CONTACT

FIELD OF THE INVENTION

The present invention relates generally to the data processing field, and more particularly, to a method, and structures for implementing differential signal circuit board electrical contact.

DESCRIPTION OF THE RELATED ART

As used in the present specification and claims, the terms circuit board, printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

A differential signal low-cost alternative is needed to contact circuit boards where required on the circuit board with another mating connection not being available to contact the circuit board differential signal.

Current state-of-the-art includes the use of independent contacts. As connector pitch decreases, mechanical mating challenges increase with an increased propensity for electrical shorts or opens. However, the minimal dimensions, for example, minimal cross section, are limited by the required spring constant. That is, if the contact cross section reaches a minimum value, mechanical spring properties cannot achieve the required normal force, thus contact resistance stability is compromised.

A need exists for an effective mechanism for implementing differential signal circuit board electrical contact.

SUMMARY OF THE INVENTION

A principal aspect of the present invention is to provide a method, and structures for implementing differential signal electrical circuit board contact. Other important aspects of the present invention are to provide such method, and structures substantially without negative effects and that overcome many of the disadvantages of prior art arrangements.

In brief, a method, and structures are provided for implementing differential signal circuit board electrical contact. A removable member including a pair of independent electrical contacts is removably received within an associated contact-receiving cavity on the circuit board. The contact-receiving cavity includes a mating pair of circuit board pads. A respective dielectric is provided between both the pair of independent electrical contacts and the mating pair of circuit board pads.

In accordance with features of the invention, the pair of independent electrical contacts is formed of a selected electrically conductive spring material, such as beryllium copper.

In accordance with features of the invention, the pair of independent electrical contacts is arranged for sliding insertion into the associated contact-receiving cavity. The pair of independent electrical contacts includes a substantially flat portion between opposed elevated end portions. The pair of independent electrical contacts includes a substantially flat bow shape.

In accordance with features of the invention, the associated contact-receiving cavity includes a tapered mating face receiving the pair of independent electrical contacts. The associated contact-receiving cavity has a cavity height for retaining and maintaining electrical contact between the pair of independent electrical contacts and the mating pair of circuit board pads.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing differential signal circuit board electrical contact.

Figure 1:
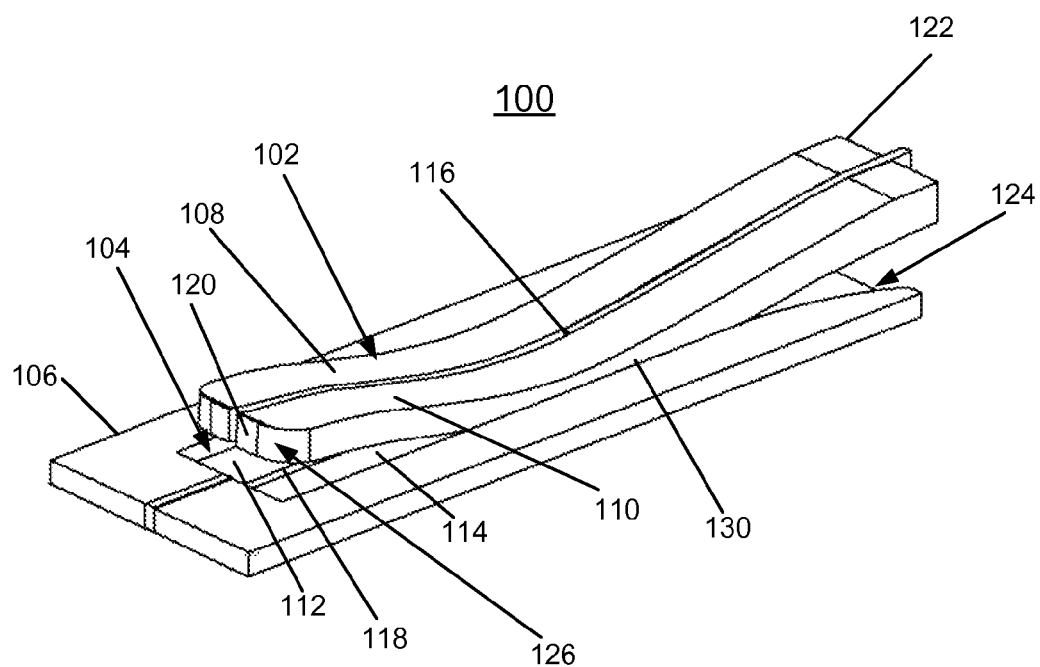
FIGS. 1 and 2 are perspective views not to scale of an example structure for implementing differential signal circuit board electrical contact in accordance with a preferred embodiment.
Figure 2:
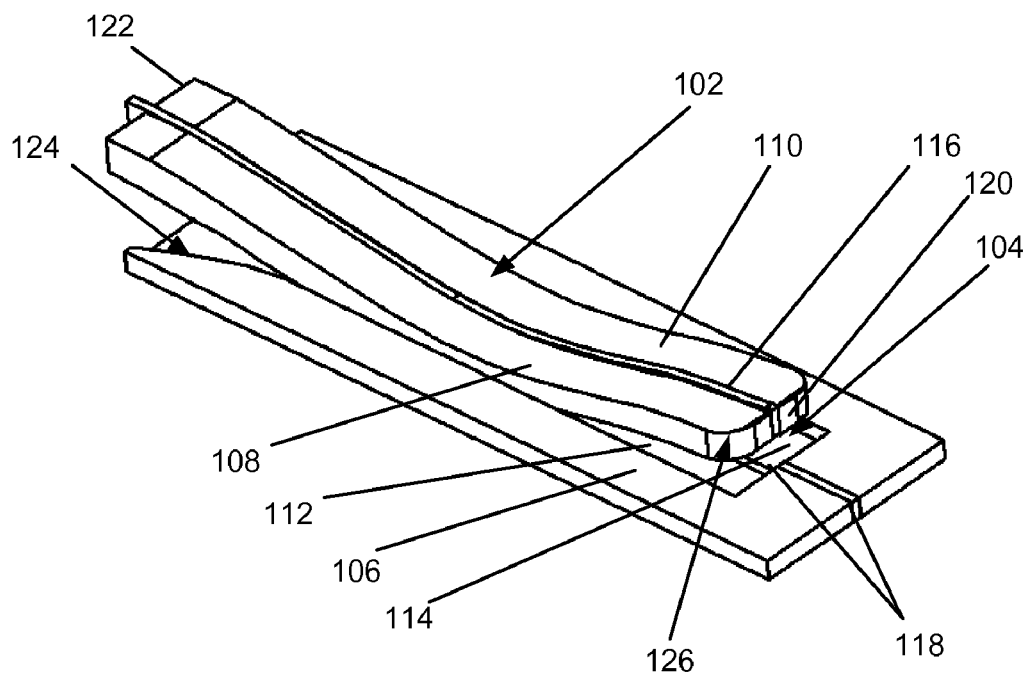

Having reference now to the drawings, in FIGS. 1 and 2 there is shown not to scale an example structure for implementing differential signal circuit board electrical contact generally designated by the reference character 100 in accordance with a preferred embodiment.

The differential signal contact structure 100 includes a removable member generally designated by the reference character 102 removably received within an associated contact-receiving cavity generally designated by the reference character 104 on a circuit board 106. The removable member 102 includes a pair of independent electrical contacts 108, 110 received within the contact-receiving cavity 104 in contact engagement with a mating pair of circuit board pads 112, 114. A dielectric 116 is provided between the pair of independent electrical contacts 108, 110. A dielectric 118 is provided between the mating pair of circuit board pads 112, 114.

The dielectric 116 extends from a front face 120 of the removable member 102 and the pair of independent electrical contacts 108, 110 past a rear face 122 of the removable member 102. The dielectric 118 extends along the length of the contact-receiving cavity 104 and to the front of the circuit board 106, as shown in FIGS. 1 and 2.

In accordance with features of the invention, the dielectric 116 divides the differential pair of contacts 108, 110 such that the impedance of the differential signal is tightly controlled. The dielectric 116 between the pair of contacts 108, 110 also serves a mechanical purpose of providing additional mechanical rigidity lost by the divided contacts.

In accordance with features of the invention, the contact-receiving cavity 104 includes a tapered lead-in entry or tapered mating face generally designated by the reference character 124 to control the registration of the contacts 108, 110 onto the pads 112, 114. The front face 120 of the removable member 102 and the pair of independent electrical contacts 108, 110 also includes a tapered shape generally designated by the reference character 126 further controlling the registration of the contacts 108, 110 onto the pads 112, 114.

The removable member 102 including the pair of independent electrical contacts 108, 110 and dielectric 116 has a generally flat bow shape with a generally flat central portion 130 extending between the opposed end portions 120, 122, which are slightly elevated above the central portion 130. The removable member 102 is inserted within the contact-receiving cavity 104 providing press-fit engagement of the contacts 108, 110 onto the pads 112, 114. The associated contact-receiving cavity 104 has a cavity height for retaining and maintaining electrical contact between the pair of independent electrical contacts 108, 110 and the mating pair of circuit board pads 112, 114.

The respective dielectric 116 and dielectric 118 function as electrical insulators, preventing the differential pair of contacts 108, 110 and the mating pair of circuit board pads 112, 114 from short-circuiting together. Each of the respective dielectric 116 and dielectric 118 is formed of a selected dielectric material, such as, HfO, ZrO, AlO or a combination thereof.

The differential pair of contacts 108, 110 is formed of a selected electrically conductive spring material, such as beryllium copper. The mating pair of circuit board pads 112, 114 is a conductor such as TiN, or TaN, W, Al, Cu, Ni, Co, Ru or a combination thereof.

Figure 3:
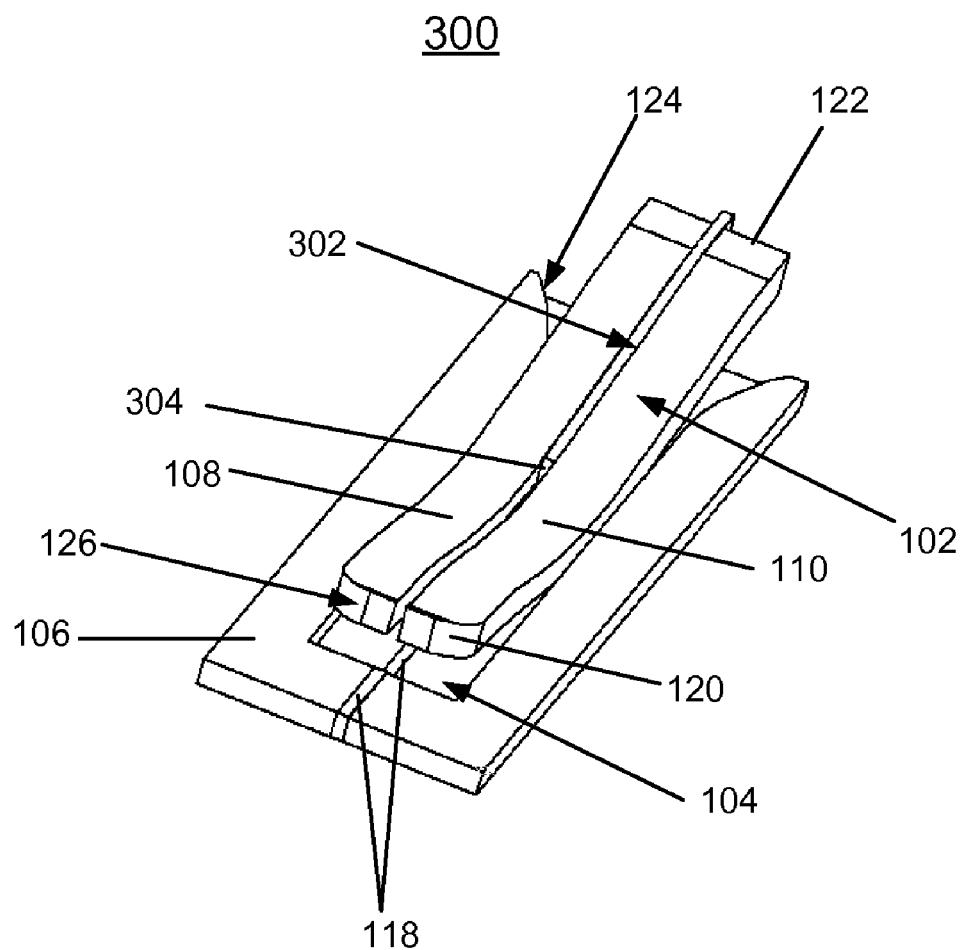
FIG. 3 is a perspective views not to scale of another example structure for implementing differential signal circuit board electrical contact in accordance with a preferred embodiment.

FIG. 3 there is shown not to scale another example structure generally designated by the reference character 300 for implementing differential signal electrical contact with a circuit board in accordance with a preferred embodiment. In FIG. 3, identical reference characters are used for identical or substantially similar components of the differential signal contact structure 300 as used for the differential signal contact structure 100 of FIGS. 1 and 2.

The differential signal contact structure 300 is similar to the differential signal contact structure 100 with a differently arranged dielectric generally designated by the reference character 302 than provided in the differential signal contact structure 100. The dielectric 302 is provided between the pair of independent electrical contacts 108, 110 and is scaled back from the front face 120 of the removable member 102.

The dielectric 302 having a forward edge 304 at a generally central portion of the of the removable member 102 extends between the differential pair of contacts 108, 110 past a rear face 122 of the removable member 102. The dielectric 302 is scaled back from the forward edge 120 of the removable member 102, for example, when additional separate compliance is needed to provide good surface contact on the two surfaces including the differential pair contacts 108, 110 on the mating pair of circuit board pads 112, 114.

The dielectric 302 is provided such that the impedance of the differential signal is tightly controlled. The dielectric 302 between the pair of contacts 108, 110 also serves the mechanical purpose, providing additional mechanical rigidity lost by the divided contacts.

Figure 4:
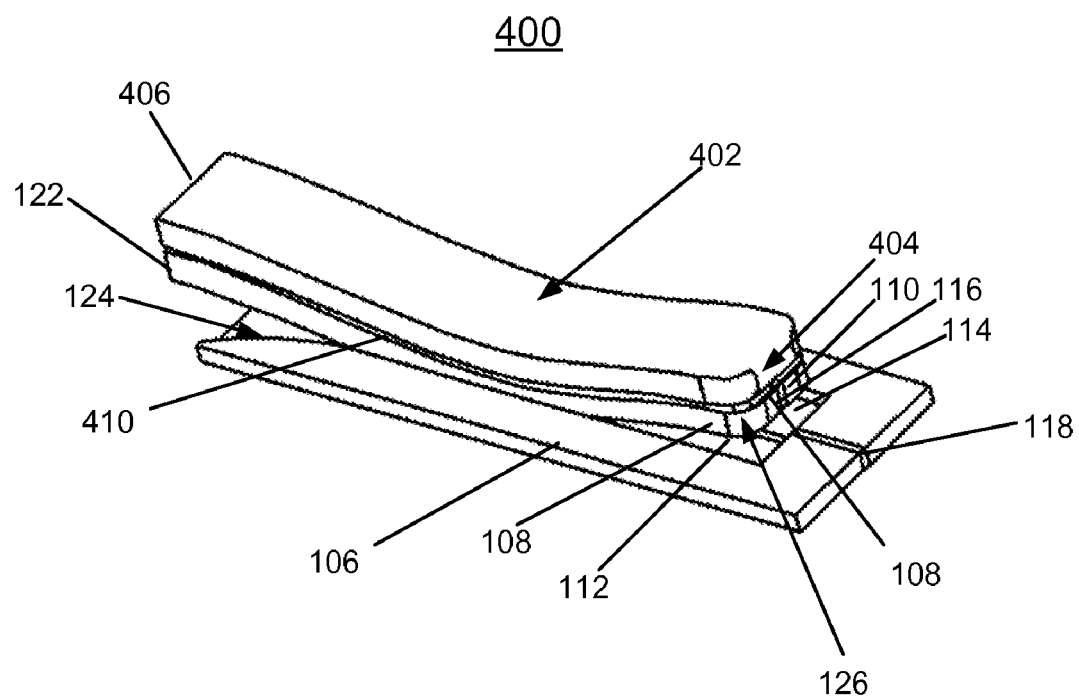
FIGS. 4 and 5 are perspective views not to scale of a further example structure for implementing differential signal circuit board electrical contact in accordance with a preferred embodiment.
Figure 5:
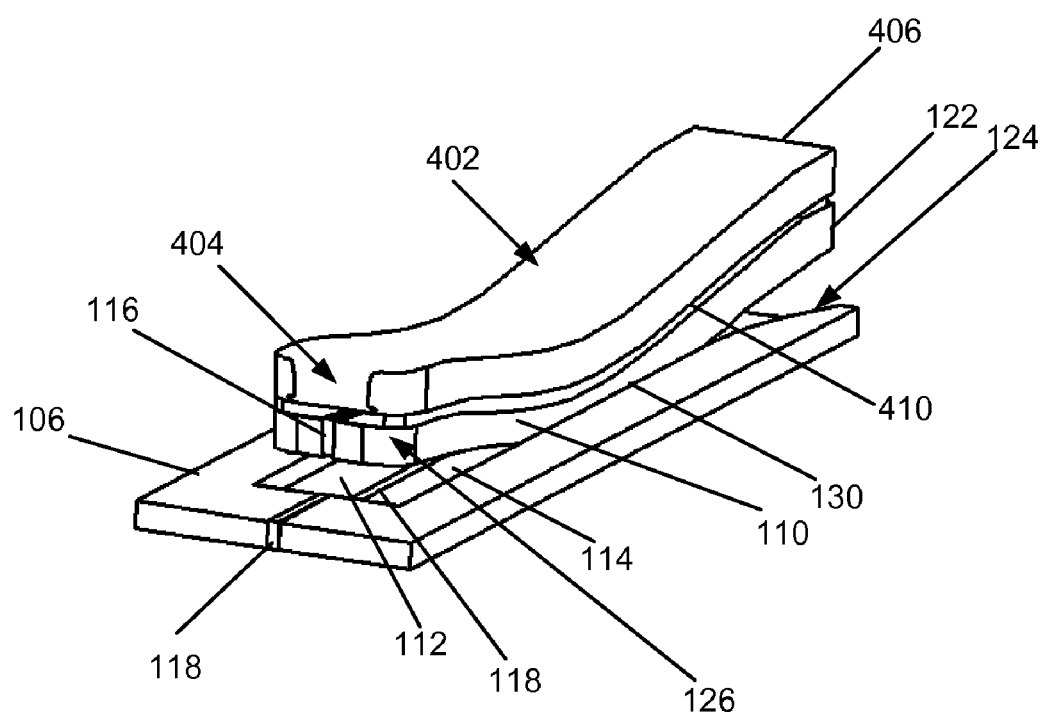

FIGS. 4 and 5 there is shown not to a further example structure generally designated by the reference character 400 for implementing differential signal electrical contact with a circuit board in accordance with the preferred embodiment. In FIGS. 4 and 5, identical reference characters are used for identical or substantially similar components of the differential signal contact structure 400 as used for the differential signal contact structure 100 of FIGS. 1 and 2.

The differential signal contact structure 400 is similar to the differential signal contact structure 100 where the differential pair of the contacts 108, 110 are stiffened by an additional top layer 402 separated by a dielectric. The top layer serves to stiffen the removable member 102 as well as electrically provide a guard surface to reduce possible cross-talk between connectors.

The additional top layer 402 has a generally flat bow shape conforming to the removable member 102 extending between a front end face generally designated by the reference character 404 and an opposed end 406, which are slightly elevated above the central portion. The additional top layer 402 is separated by a correspondingly shaped additional dielectric 410 from the removable member 102.

The additional top layer 402 is formed of a selected stiffener material, such as, an electrically conductive material such as TiN, TaN, W, WN, Al, Cu, Ni, Co, Ru or a combination thereof. The additional dielectric 410 is formed of a selected dielectric material, such as, HfO, ZrO, AlO or a combination thereof.

While the present invention has been described with reference to the details of the embodiments of the invention shown in the drawing, these details are not intended to limit the scope of the invention as claimed in the appended claims.

What is claimed is:

1. A structure for implementing differential signal circuit board electrical contact comprising:
    a contact-receiving cavity on the circuit board;
    a removable member removably received within said contact-receiving cavity and including a pair of independent electrical contacts;
    said contact-receiving cavity including a mating pair of circuit board pads engaging said pair of independent electrical contacts; and
    a respective dielectric disposed between each of said pair of independent electrical contacts and said mating pair of circuit board pads.

2. The structure as recited in claim 1 wherein said pair of independent electrical contacts is formed of a selected electrically conductive spring material.

3. The structure as recited in claim 1 wherein said pair of independent electrical contacts is formed of beryllium copper.

4. The structure as recited in claim 1 wherein said contact-receiving cavity includes a tapered mating face receiving said removable member and said pair of independent electrical contacts.

5. The structure as recited in claim 1 wherein said contact-receiving cavity has a cavity height for retaining and maintaining electrical contact between the pair of independent electrical contacts and the mating pair of circuit board pads.

6. The structure as recited in claim 1 wherein said dielectric disposed between said pair of independent electrical contacts extends from a front face of the removable member to a rear face of the removable member.

7. The structure as recited in claim 1 wherein said dielectric disposed between said pair of independent electrical contacts extends from a generally central portion of the removable member to a rear face of the removable member.

8. The structure as recited in claim 1 wherein said pair of independent electrical contacts includes a substantially flat portion extending between opposed elevated end portions.

9. The structure as recited in claim 1 wherein said pair of independent electrical contacts includes a substantially flat bow shape.

10. The structure as recited in claim 1 further includes a top layer stiffener disposed above said removable member.

11. The structure as recited in claim 10 wherein said top layer stiffener has a corresponding shape conforming to said removable member.

12. The structure as recited in claim 10 includes a dielectric extending between said top layer stiffener and said removable member.

13. The structure as recited in claim 10 wherein said dielectric is formed of a dielectric material selected from the group of HfO, ZrO, AlO or a combination thereof.

14. The structure as recited in claim 10 wherein said top layer stiffener is formed of an electrically conductive material.

15. The structure as recited in claim 1 wherein said dielectric disposed between each of said pair of independent electrical contacts and said mating pair of circuit board pads is formed of a dielectric material selected from the group of HfO, ZrO, AlO or a combination thereof.

16. A method for implementing differential signal circuit board electrical contact comprising:
   providing a contact-receiving cavity on the circuit board;
   providing a removable member for sliding insertion within said contact-receiving cavity and said removable member including a pair of independent electrical contacts;
   providing a mating pair of circuit board pads in said contact-receiving cavity engaging said pair of independent electrical contacts; and
   providing a respective dielectric disposed between each of said pair of independent electrical contacts and said mating pair of circuit board pads.

17. The method as recited in claim 16 wherein the step of providing a contact-receiving cavity on the circuit board includes providing said contact-receiving cavity with a tapered mating face receiving said removable member.

18. The method as recited in claim 16 wherein the step of providing a removable member for sliding insertion within said contact-receiving cavity includes providing said removable member with a substantially flat bow shape.

19. The method as recited in claim 16 wherein the step of providing a removable member for sliding insertion within said contact-receiving cavity further includes providing a top layer stiffener disposed above said removable member.

20. The method as recited in claim 16 wherein the step of providing a removable member for sliding insertion within said contact-receiving cavity includes forming said pair of independent electrical contacts of a selected electrically conductive spring material.

* * * * *